US005903059A

United States Patent [19]
Bertin et al.

[11] Patent Number: 5,903,059
[45] Date of Patent: May 11, 1999

[54] MICROCONNECTORS

[75] Inventors: Claude Louis Bertin, South Burlington; John E. Cronin, Milton, both of Vt.

[73] Assignee: International Business Machines Corporation, Armonk, N.Y.

[21] Appl. No.: 08/560,257

[22] Filed: Nov. 21, 1995

[51] Int. Cl.[6] .......................... H01L 23/48; H01L 23/02; H01L 23/52

[52] U.S. Cl. .......................... 257/785; 257/686; 257/777; 439/74; 439/284

[58] Field of Search .................................. 257/686, 777, 257/785; 439/74, 284

[56] References Cited

U.S. PATENT DOCUMENTS

| | | | |
|---|---|---|---|
| 3,153,581 | 10/1964 | Hutchins, IV | 257/785 |
| 3,526,867 | 9/1970 | Keeler et al. | 439/74 |
| 4,467,342 | 8/1984 | Tower | 257/686 |
| 4,754,316 | 6/1988 | Reid | 257/686 |
| 4,761,681 | 8/1988 | Reid | 257/678 |
| 4,801,992 | 1/1989 | Golubic et al. | 257/678 |
| 4,931,021 | 6/1990 | Mohan | 439/284 |
| 4,950,173 | 8/1990 | Minemura | 439/82 |
| 4,999,311 | 3/1991 | Dzarsoski | 437/51 |
| 5,006,073 | 4/1991 | Mennona | 439/77 |
| 5,089,880 | 2/1992 | Meyer et al. | 257/686 |
| 5,110,298 | 5/1992 | Dorinski et al. | 439/65 |
| 5,116,462 | 5/1992 | Bartha et al. | 156/643 |
| 5,130,276 | 7/1992 | Adams et al. | 437/225 |
| 5,202,754 | 4/1993 | Bertin et al. | 257/777 |
| 5,299,939 | 4/1994 | Walker et al. | 439/74 |
| 5,312,456 | 5/1994 | Reed et al. | 411/456 |

OTHER PUBLICATIONS

Reed et al. "Silicon Micro–Velcro**", Advanced Materials 4 (1992) No.1, pp. 48–52.
Han et al., "Micromechanical Velcro", JMS, vol. 1, Mar. 1992, pp. 37–42.
Munchmeyer et al., "Manufacture of three–dimensional microdevices using synchrotron radiation (invited)", Rev. Sci. Instrum. 63(1), Jan. 1992.

*Primary Examiner*—Teresa M. Arroyo
*Attorney, Agent, or Firm*—James M. Leas

[57] ABSTRACT

Microconnectors are described that can be fabricated on circuitry, the microconnectors for physically and/or electrically connecting separate structures. The microconnectors permit partitioning of a function among a plurality of chips. The microconnectors include a latching member.

24 Claims, 14 Drawing Sheets

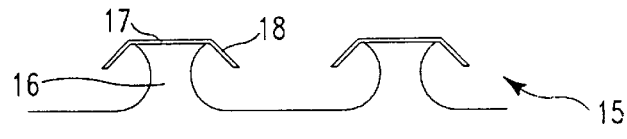
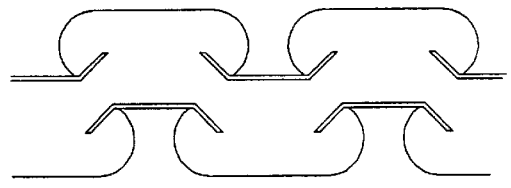
PRIOR ART
FIG. 1a
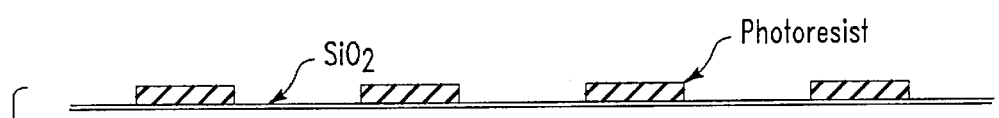
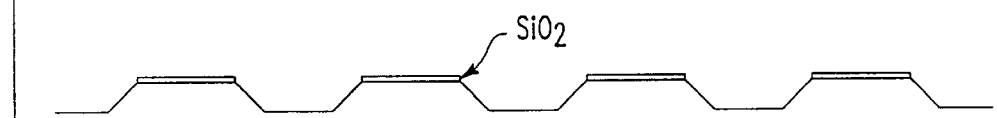
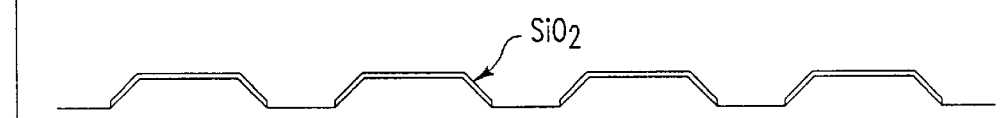
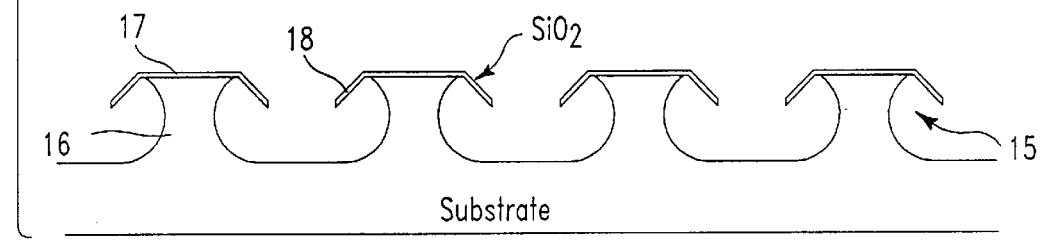
FIG. 1b PRIOR ART

ALIGNMENT SEQUENCE

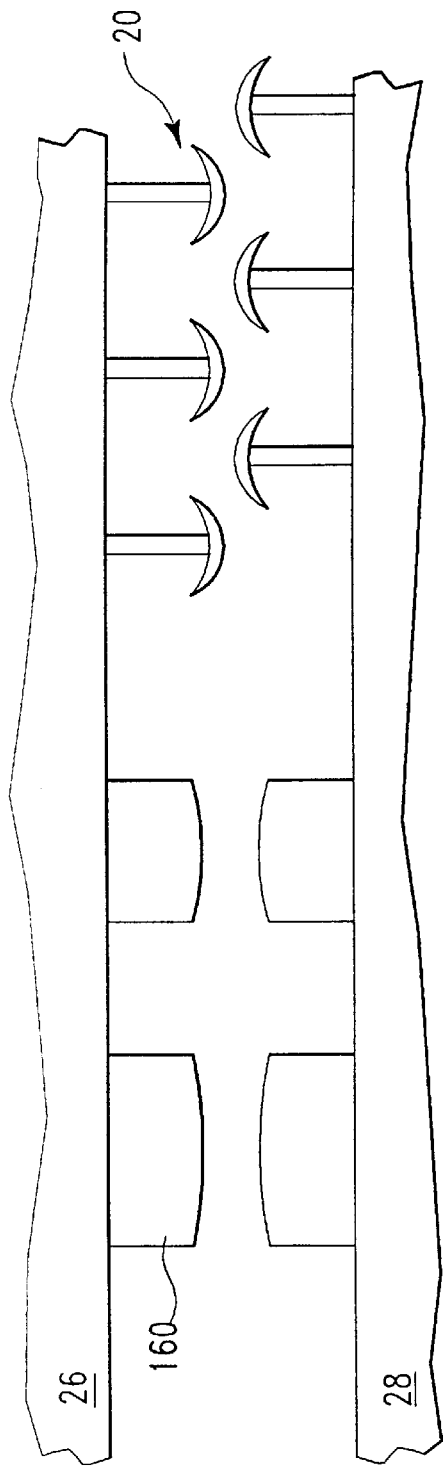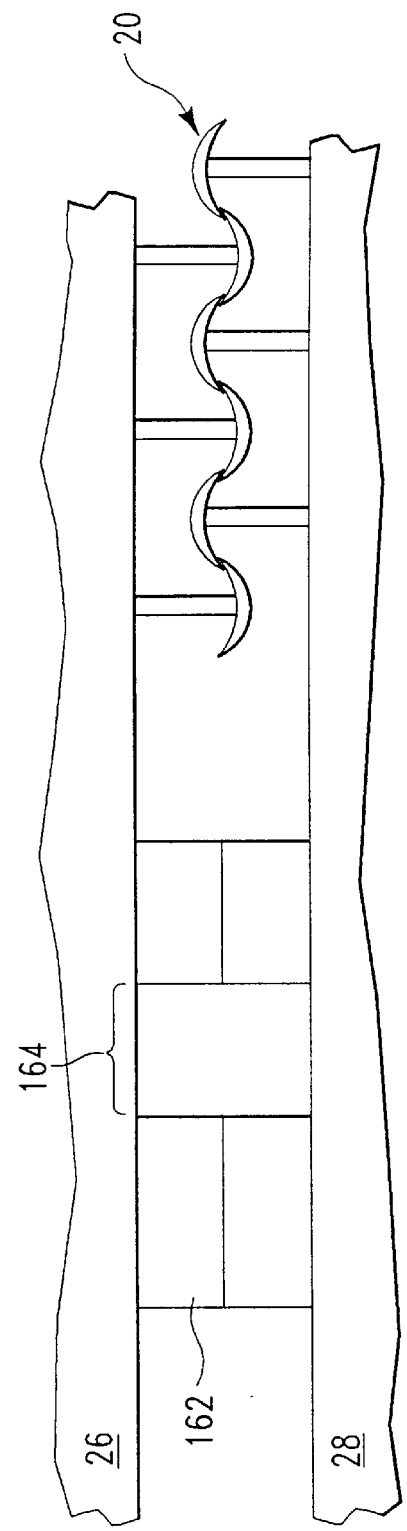

MICROCONNECTORS

CROSS-REFERENCE TO RELATED APPLICATION

This application contains subject matter which is related to the subject matter of the following applications which are assigned to the same assignee as this application, all of which are being filed concurrently herewith:

"Chip Function Separation onto Separate Stacked Chips," by C. Bertin et al., Ser. No. 08/560,222, filed Nov. 21, 1995, filed Nov. 21, 1995; and "Programmable Logic Array", by C. Bertin et al., Ser. No. 08/560,250, filed Nov. 21, 1995.

TECHNICAL FIELD

The present invention generally relates to three-dimensional semiconductor chips. More particularly, the present invention relates to microconnectors for physically and/or electrically connecting semiconductor chips together.

BACKGROUND

At least two problems are addressed by the present invention, chip area and chip fabrication turn-around-time. With respect to chip area, improvements are limited by the ability of designers to physically connect some structures to other structures without substantially increasing the area of a chip. For example, with electrically erasable programmable read only memory (EEPROM), there is increasingly a mismatch between the dimensions of drive circuitry that requires a relatively high voltage and the memory arrays that operate at low voltage. With each technology advance the arrays can get smaller and smaller, but, because of the need for high voltage, the drivers and decoders remain larger. More specifically, as photolithographic improvements permit the pitch of array word lines to decrease, the ability to fit individual word line drivers and decoders within the array pitch is strained because of the continuing high voltage write requirements for the word lines. Thus, the word line drivers and decoders can limit an array pitch that can otherwise be reduced, substantially increasing word line pitch above minimum dimensions and increasing the size of a chip needed for a given amount of memory.

Thus, a need exists for a way to accommodate the differing area requirements of interconnected structures within a semiconductor chip without sacrificing the ability to implement density improvements.

With respect to turn-around-time (the time it takes to design and manufacture a chip), fabrication speed has become vital to achieving a rapid time to market for new logic products. However, commonly accepted penalties for the achievement of a rapid turn-around time for programmable arrays, interconnects, or combinations of programmable arrays and bus interconnects, include lower circuit density, slower performance, interconnection inefficiency, and performance delays. Such is the case with programmable logic arrays (PLAs). Countering this, there is constant pressure to increase the density of semiconductor chips in general, and in particular PLAs.

Thus, a need exists for a way to decrease the turn-around time for PLAs while retaining high density for the array.

SUMMARY OF THE INVENTION

Briefly, the present invention accommodates either differing area needs of some interconnected structures on semiconductor chips or allows rapid turn-around-time, without sacrificing circuit density. These needs are satisfied by separating portions of a circuit onto separate stacked chips. The circuit pieces on the separate chips are interconnected with microconnectors so they can function as if they were on the same chip.

A paper, "Micromechanical Velcro," by H. Han, et al., published in the *Journal of Micromechanical Systems,* Vol. 1, no. 1, March 1992, describes a process for fabricating micromechanical mating structures 15 having single crystal silicon pedestals 16 with oxide caps 17 that provide overhanging arms 18, as shown in FIGS. 1a–1b. Such micromechanical structures on two identical surfaces can self-align and interlock with each other under application of adequate external pressure. Advantages over conventional adhesives listed in the paper include thermal tolerance, resistance to chemical attack, and self-alignment. However, the process steps require high temperature oxidation, and the structure requires access to the silicon substrate and uses valuable silicon real estate.

The present invention improves upon the micromechanical velcro of Han, et al. to provide a structure and process for interconnecting chips using micromechanical mating structures not necessarily made from silicon substrate material, avoiding the potential for shorting to the substrate. In addition, the present invention avoids high temperature processing steps, allowing the structures to be formed after other semiconducting processing steps have been completed. The present invention also provides microconnectors on top of other semiconductor structures, avoiding the need to use silicon real estate. And, in addition to simply providing mechanical connection, the microconnectors of the present invention also allow for individualized electrical connection between portions of a circuit on different chips.

In accordance with the above, it is an object of the present invention to provide a micromechanical mating structure after circuits and interconnects have been fabricated.

It is a feature of the present invention that steps to form a micromechanical mating structure are accomplished at low temperature.

It is a feature of the present invention that steps to form a micromechanical mating structure are accomplished using materials other than a single crystal silicon substrate.

It is a feature of the present invention that a micromechanical mating structure is located on circuit elements.

It is another object of the present invention to provide microconnectors to mechanically connect a chip with a substrate without adhesive.

It is another object of the present invention to provide microconnectors to electrically connect a chip to a substrate.

It is another object of the present invention to provide microconnectors so as to enable the separation of chip functions or circuit portions onto separate interconnected stacked chips.

It is a feature of the present invention that a micromechanical latching mechanism is used for a mechanical mating structure.

It is an object of the present invention to provide mechanical alignment of chips using microconnectors.

It is an object of the present invention to provide a force-counterforce arrangement to ensure good electrical contact between microconnectors.

These, and other objects, features and advantages of the invention will become apparent from the following detailed description of the various aspects of the invention taken in conjunction with the accompanying drawings.

The present invention provides a semiconductor structure capable of providing a physical interconnection to a mating substrate. The semiconductor structure includes circuitry having both a semiconductor portion and a level on the semiconducting portion. It also includes microconnectors on this level, the microconnectors including a latching member, the microconnectors being capable of mechanical connection with the mating substrate.

BRIEF DESCRIPTION OF THE DRAWINGS

FIG. 1a is a cross sectional view of a prior art microconnector formed from the single silicon crystal substrate.

FIG. 1b is a cross sectional view of prior art process steps for fabricating the microconnectors of FIG. 1a in a silicon substrate.

FIGS. 9a–9b are cross sectional views of the microconnectors of FIG. 2 used in conjunction with seals to provide functions such as cooling.

DESCRIPTION OF THE INVENTION

The present invention provides a way of interconnecting structures on two semiconductor chips so intimately that they can function as if the structures were all on the same chip. Thus, an EEPROM memory array can have all its cells and wordlines located on one of the chips while the high voltage word line drivers and decoders of the memory array can be on the other of the chips, the two connected by the microconnectors of the present invention. Similarly, PLA memory arrays can be located on one chip while PLA logic circuitry is located on the other chip, the two interconnected to form a functional PLA that has both high array density and rapid turn-around-time.

The microconnectors can be formed on insulating or conductive pads of each chip after other semiconductor fabrication process steps. The microconnectors mechanically interconnect to provide a physical connection, an electrical connection, or both a physical and an electrical connection. Mechanical interconnection is by latching, and latching can be made to occur by means such as the application of a force. Force-responsive latching microconnectors may provide latching when substrates on which they are mounted are pressed or forced together as described hereinbelow.

Figure 2:
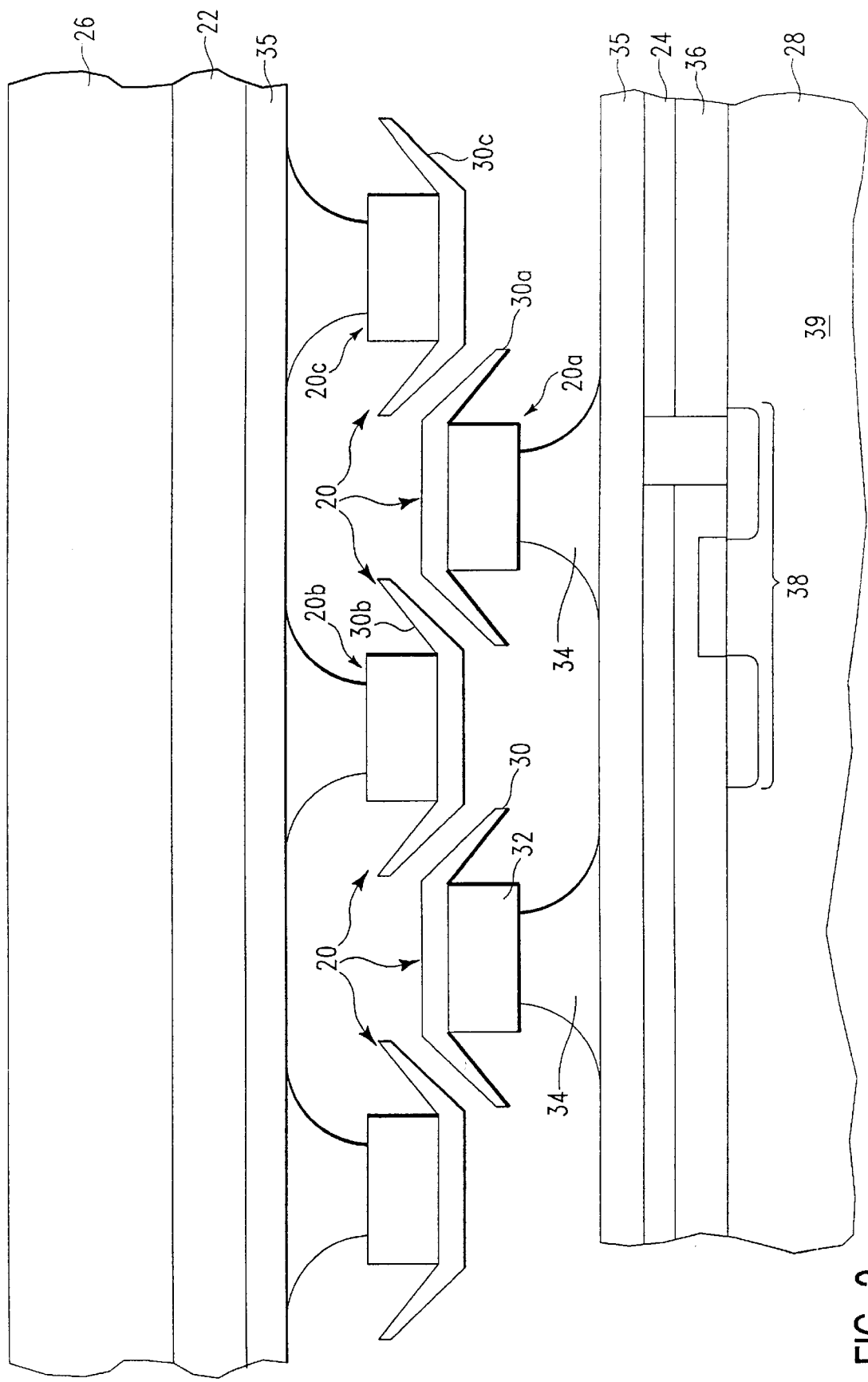
FIG. 2 is a cross sectional view of one embodiment of microconnectors of the present invention used to connect stacked chips.

FIG. 2 depicts force-responsive self-interlocking connectors 20 (hereinafter, referred to as "FSCs") residing on connection pads 22 and 24 of top chip 26 and bottom chip 28 respectively. Each FSC 20 comprises flexible top 30, post 32, and stem 34 on base 35 on connection pads 22 and 24 respectively. FSCs 20 may be made of conductive materials, such as aluminum, copper, beryllium copper, or tungsten. They may also be formed of insulating materials, such as silicon oxide, silicon nitride, and polyimide. As bottom chip 28 and top chip 26 are forced together, FSC flexible tops 30 on both chips bend, allowing the insertion of an FSC on one chip between FSCs on the other, latching the two chips together. For example, as chips 26 and 28 are pressed together by application of a force, FSC 20a is inserted between FSCs 20b and 20c, with flexible tops 30 of each FSC bending to allow the insertion. Once flexible tops 30a of FSCs on chip 28 have cleared flexible tops 30b and 30c of FSCs 20a and 20b on chip 26, the FSCs self-interlock, or latch, and the chips become physically connected together. The more FSCs used, the stronger and more reliable the physical connection between the chips. Pad 24 is formed on insulating layer 36. There may be several wiring levels and insulating levels interconnecting devices 38 and forming circuitry on silicon substrate 39 of chip 28 beneath the level of pad 24.

While flexible tops 30 are shown sloping, a similar result can also be achieved with flat flexible tops. Sloping tops make insertion easier while flat flexible tops are simpler to fabricate and make disconnection easier.

A process for fabricating micromechanical interlocking structures is presented in the Han paper and is shown in FIG. 1b. In the Han process, a first thermal oxide and masking step is followed by an anisotropic etching along crystallographic planes in silicon, resulting in truncated pyramids. Then, a second thermal oxidation and masking step is used to pattern the oxide to provide a mask for an isotropic etching of the silicon substrate that leaves overhanging silicon dioxide arms.

As the paper points out, the second masking step poses particular difficulties since the surface is highly nonplanar after the first mask. In addition, high temperature processing steps are needed to form the thermal oxide tops, precluding the process from use after circuits and interconnects have been formed. Also, the process proposed by the Han paper requires access to the bulk silicon substrate and uses up silicon area.

An alternate structure and process to the one disclosed in the Han paper will now be described. The process of the present invention avoids the need for patterning a highly nonplanar surface. It also allows fabrication of a microconnector in a range of materials that do not etch differently along different crystal planes. It thus allows fabrication of microconnectors formed of highly conductive materials, such as metals, for self-clamping electrical microconnectors, and does not require access to the silicon substrate. Thus, the present invention is suitable for use on circuit layers to interconnect circuits on one chip with circuits on another.

FIGS. 3a–3f illustrate the steps of fabrication of FSCs of the present invention. Post 32 having sidewalls 40 is formed on base 35 by deposition, masking, and etching. For a conductive FSC, base 35 can be located on electrically conductive pad 22, 24 (FIG. 2) or, for a nonconductive FSC, it may be formed on an insulating layer. For electrically conductive FSCs, base 35 and post 32 are formed of a conductive material, and base 35 is in electrical contact with a desired portion of circuitry below (see FIG. 2). Appropriate conductive materials include metals, such as aluminum, nickel, chromium, gold, copper, tungsten, or molybdenum. Heavily doped single crystal or polycrystal silicon or an insulator coated with a conductor, such as metal coated polyimide, oxide, or nitride, can also be used.

Figure 4:
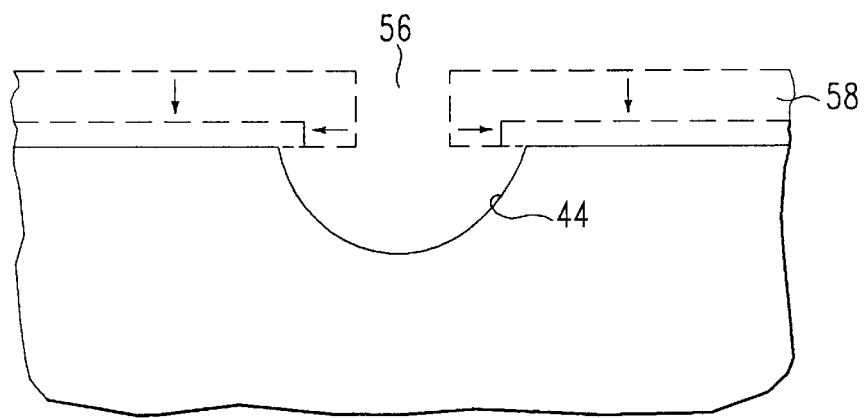
FIG. 4 is a cross sectional view of a process step to form the sloping sidewall of FIG. 3b.

After post 32 has been defined, sacrificial material 42 is deposited over post 32 and base 35 such that slope 44 is created on side walls 40 of post 32. Slope 44 can be formed by methods such as spin applying a material such as spin on glass, resist, or polyimide. Alternatively, mandrel flair-out portions 46 having slope 44 can be formed by conformally depositing material 42 and then sputter etching or directed ion beam etching at an angle while rotating the wafer. Slope 44 can also be formed by providing an isotropic etch through window 56, the etch depending on the lateral etch rate of mask 58, as shown in FIG. 4.

Figure 3A:
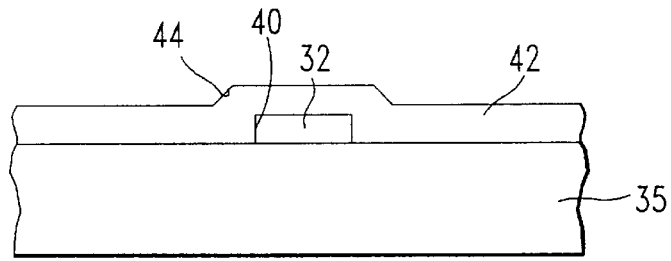
FIGS. 3a–3f are cross sectional views of process steps of the present invention for fabricating microconnectors on circuitry.
Figure 3B:
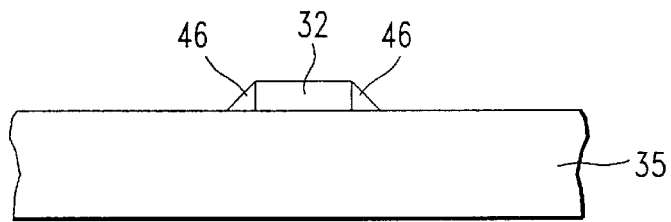

As shown in FIG. 3b, material 42 is then etched back, removing material 42 from horizontal surfaces, but stopping the etch in time to leave mandrel flair-out portion 46 adjacent sidewalls 40. Note that the directional etch need not be selective to base 35. If the etch rate of materials 32, 46 and 35 are identical, the rectangular image with sloping sidewalls will be translated into base 35, for example.

Figure 3C:
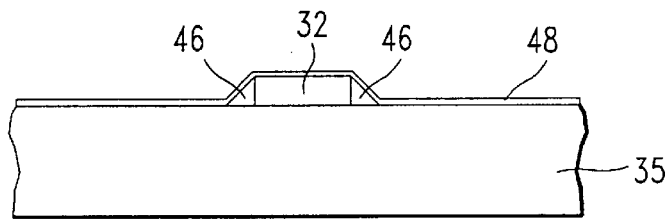

In the next step, shown in FIG. 3c, conformal material 48 is applied over post 32 and mandrel flair-out portion 46. To provide an electrical connector conformal material 48 is formed of a conductive material as described hereinabove for post 32.

Figure 3D:
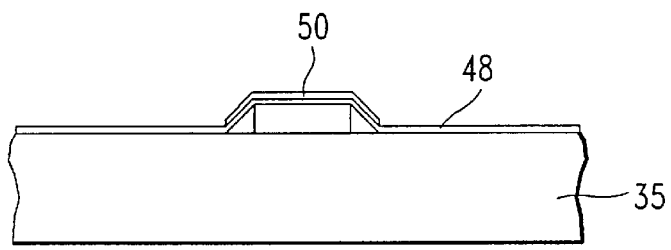
Figure 3E:
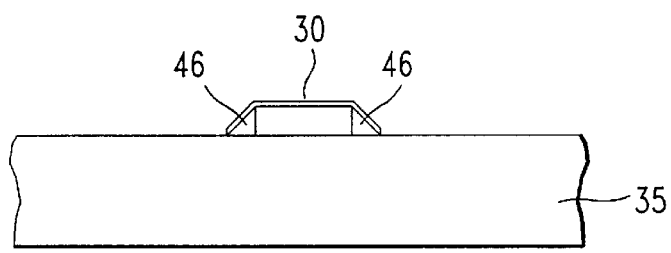

Mask 50 is then created over conformal material 48 covering post 32 and mandrel flair-out portion 46, as shown in FIG. 3d. Mask 50 may be created by depositing a layer of photosensitive material, exposing, and developing portions beyond the area above post 32 and mandrel flair-out portion 46. The portion of conformal material 48 not covered by mask 50 is then etched away, and mask 50 is removed as shown in FIG. 3e, leaving flexible top 30 on post 32 and mandrel flair-out portion 46. Control over the lateral extent of flexible top 30 is provided by mask 50.

Figure 3F:
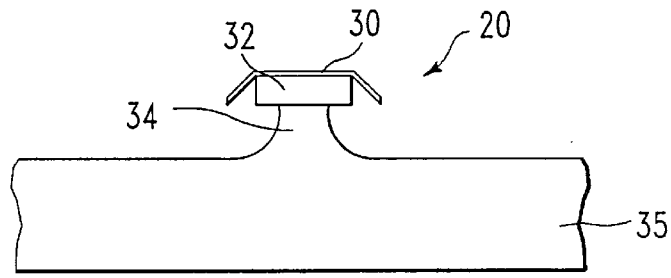

As defined by flexible top 30, base 35 and mandrel flair-out portion 46 are then etched away to form FSC 20, shown in FIG. 3f, comprising flexible top 30, post 32 and stem 34 on top of what is left of base 35 after creating stem 34. The etch of base 35, as shown in FIG. 3f, is isotropic (the vertical etch rate is about equal to the horizontal undercut). Post 32 provides significantly greater support for flexible top 30 than would be provided by stem 34 alone.

The materials chosen for the various sections of FSC 20 shown are chosen to provide good adhesion between flexible top 30, post 32, stem 34, and base 35. In addition, mandrel flair-out portion 46 is preferably formed of a material that is removable with an etchant that does not effect flexible top 30. Stem 34 and base 35 need not be the same material; stem 34 may be formed of a layer on top of base 34.

Providing stem 34 and base 35 of different materials with different etch properties permits separate control over the length and width of stem 34. This is accomplished by providing a top layer of material on base 35 before depositing the material for post 32. Once this top layer has been penetrated by the etchant a different etchant may be used to continue to lengthen stem 34 into base 35 without further undercutting post 32. If stem 34 and base 35 are formed of the same material, then separate control over the length and width of stem 34 can still be obtained by providing a directional etch step, such as a reactive ion etch defined by flexible top 30, to provide most of the height of stem 34. An isotropic etch shown in FIG. 3f, provides undercutting of flexible top 30 providing the clearance needed for latching. This isotropic etch step can be either before or after the directional etch step.

Post 32 is preferably formed of a material that is removable without the etchant affecting either mandrel flair-out portion 46 or stem 34. Thus, the shape of post 32 is retained when mandrel flair out portions 46 and base 32 are etched. If post 32 and stem 34 were the same material, post 32 would be etched along with base 35, and the isotropic etch to create stem 34 would create a pedestal narrowing from base 35 to flexible top 30. Of course, if a directional etch step is used, such as a reactive ion etch, then this narrowing can be precisely controlled, as described hereinabove.

The chart below illustrates different possible combinations of materials that can be used for each part of FSC 20. For mechanical connectors on an oxide-insulated chip case 1 provides the simplest materials. Spin-on glass is relatively inexpensive and nitride is very flexible and has a low etch rate relative to oxide. On the other hand, if the chip is insulated with polyimide, case 11 would be preferred for mechanical connectors. For electrical connectors, post, top, stem, and base need include conductors, as provided in cases 19, 20, 24, and 25.

TABLE #1

| | MATERIALS | | | |
|---|---|---|---|---|
| POST | MANDREL FLAIR-OUT PORTIONS | FLEXIBLE TOP | STEM | BASE |
| Case 1 nitride | spin-on glass | nitride | oxide | oxide |
| Case 2 nitride | spin-on glass | metal | oxide | oxide |
| Case 3 metal | spin-on glass | metal | oxide | oxide |
| Case 4 nitride | spin-on glass | nitride | oxide (fast etch) | oxide (slow etch) |
| Case 5 nitride | spin-on glass | metal | oxide (fast etch) | oxide (slow etch) |
| Case 6 metal | spin-on glass | metal | oxide (fast etch) | oxide (slow etch) |
| Case 7 nitride | spin-on glass | nitride | silicon | silicon |
| Case 8 nitride | spin-on glass | metal | silicon | silicon |
| Case 9 metal | spin-on glass | metal | silicon | silicon |
| Case 10 oxide | spin-on glass | nitride | polyimide | polyimide |
| Case 11 nitride | oxide | nitride | polyimide | polyimide |
| Case 12 oxide | oxide | nitride | oxide | polyimide |
| Case 13 polyimide | spin-on glass | nitride | polyimide | polyimide |
| Case 14 oxide | spin-on glass | metal | polyimide | polyimide |
| Case 15 nitride | oxide | metal | polyimide | polyimide |
| Case 16 oxide | oxide | metal | oxide | polyimide |
| Case 17 polyimide | spin-on glass | metal | polyimide | polyimide |
| Case 18 metal | oxide | nitride | metal | metal |

TABLE #1-continued

| | | MATERIALS | | | |
|---|---|---|---|---|---|
| | POST | MANDREL FLAIR-OUT PORTIONS | FLEXIBLE TOP | STEM | BASE |
| Case 19 | metal | oxide | metal | metal | metal |
| Case 20 | metal | polyimide | metal | metal | metal |
| Case 21 | metal | spin-on glass | oxide | metal | metal |
| Case 22 | nitride | spin-on glass | nitride | metal | metal |
| Case 23 | metal | oxide | nitride | metal type 2 | metal type 1 |
| Case 24 | metal | oxide | metal | metal type 2 | metal type 1 |
| Case 25 | metal | polyimide | metal | metal type 2 | metal type 1 |
| Case 26 | metal | spin-on glass | oxide | metal type 2 | metal type 1 |
| Case 27 | nitride | spin-on glass | nitride | metal type 2 | metal type 1 |

In the table above, "metal type 1" and "metal type 2" are preferably metals with etches selective to each other. For example metal type 1 can be aluminum, copper, nickel, or chromium while metal type 2 can be tungsten, or metal type 1 can be chromium while metal type 2 can be aluminum.

The present microconnector invention provides a way to maintain the pitch of word lines and bit lines coming from a three-dimensional direct-write EEPROM array by separating the drivers (and their associated decoders) from the rest of the EEPROM array onto another chip, as more fully described in the first related patent application, Ser. No. 08/560,222, incorporated herein by reference. In brief, a second chip is stacked face to face with the EEPROM array chip and connected thereto using the microconnectors of the present invention. The separation of the drivers and the interconnection at the device level afforded by the microconnectors allows different technologies (such as low and high voltage chips) to be used for the array and for the drivers. The separation and microconnection schemes also allows for optimizing the space design of each chip and allows the large high voltage drivers to remain within the array pitch. Because the drivers and decoders are moved off chip, the separation and microconnection scheme may permit larger or higher performance drivers, higher overall chip performance, and smaller chips.

The silicon chip area required for microconnectors in areas 62, 64, 66, and 68 of FIG. 6a of the first accompanying patent application, Ser. No. 08/560,222, can be eliminated by moving the microconnectors to another level of metal on top of bit lines of the array. In this embodiment, standard vias or studs extend up from word lines, and metal lines extend in a level of metal on insulator above the bitlines. Plenty of room is then available on this level of metal for forming reliable electrically conductive microconnectors. In this embodiment, space along the chip surface adjacent to the array is eliminated for both the high voltage drivers and for the microconnectors themselves, substantially reducing chip area. This is illustrated in FIG. 6b–6f of the first accompanying patent application.

By separating EEPROM array functions onto two chips and providing microconnectors therebetween, the present invention permits significantly reducing the size of an array of a given number of cells. Alternatively, the present invention permits increasing the number of cells that can be provided on a chip of a given size.

In the present invention, one chip can be smaller than the other, or the chips can be staggered, providing a peripheral region on at least one of the chips for external connection.

Another example of the use of microconnectors, for array logic, is more fully described in the second related application, Ser. No. 08/560,250, incorporated herein by reference. In brief, a three-dimensional programmable logic array is divided into circuits on a top chip and on a bottom chip. The top chip comprises input/output circuitry, drivers, feedback, and several contact pads on its bottom surface. The bottom chip comprises modified EEPROM memory, input/output, and contact pads on its top surface. The electrical connections between the chips are made by microconnectors on contact pads. The division of function permits significantly higher array density and more rapid manufacturing time than presently available.

An electrical connection between stacked chips can be accomplished if the materials for the flexible top, mandrel stem and base include electrical conductors, as described hereinabove. Significant advantage is also achieved by using FSCs solely as mechanical connectors to clamp chips together while separate electrical connections provide the electrical contacts. Separate electrical connections include gold bumps, pins, dendrites, wire bonds, fuzz buttons, and reflowable connections. A "reflowable connection" is one in which a metallurgical contact between chips is made by applying heat to melt a material, such as solder. Only a small amount of the reflowable material is needed to give an electrical connection, so the reflowable connections can be small, on the order of 2 to 10 micrometers. This is the case since mechanically connecting FSCs provide the mechanical strength needed to hold the chips together.

Figure 5:
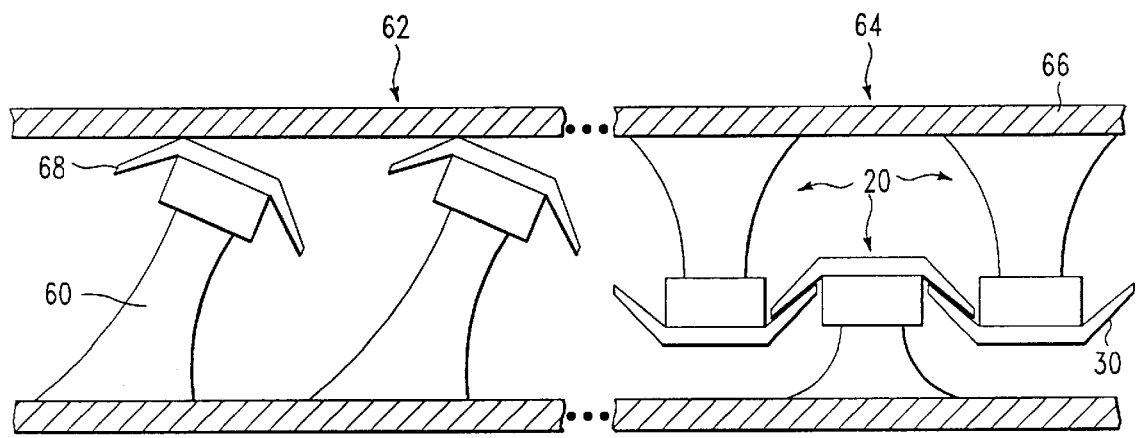
FIG. 5 is a cross sectional view of a microconnectors of FIG. 2 with repelling members on the same chip stack to provide a force-counter-force arrangement.

In addition, to ensure a reliable electrical connection between chips, the present invention includes another electrical connection scheme, a force-counter-force connection that provides a continuing force between conductive FSCs of the two chips, locking them into intimate physical contact. FIG. 5 depicts repelling members 60 in repelling member area 62 and FSCs 20 in FSC area 64, both part of a pair of stacked chips according to the present invention. Repelling members 60 are shown with a slight bend, providing the pushing force countering FSCs 20 in area 64. Electrically conductive repelling members 60 wipe against pads 66 on the opposite chip as pressure is applied to engage FSCs 20, improving electrical contact.

Repelling members 60 resemble FSCs 20, but there are two differences: first top member 68 of repelling member 60 extends sufficiently to push on a surface of the opposing chip, and second, structure for latching is not needed. FSCs 20 in area 64 are described above (under the description of FIG. 2), and these FSCs provide restraining action against repelling members 60 while repelling members 60 provide a counterforce to push FSCs 20 back toward each other. Where the stacked chips include both areas 62 and 64, which act against each other, a counterforce ensuring an electrical connection is maintained, and electrical contact can be formed with either repelling members 60 or FSC's 20. Thus, either repelling members 60 or FSCs 20 may be conductive, or both may be conductive. One approach is to include conductive repelling members on one portion of a chip with insulating FSCs on another portion of the chip. Top members 68 of repelling members 60 can extend taller than top members 30 of FSCs 20 by providing repelling members 60 with longer stems. Members with longer stems are formed in separate processing steps, and those formed first are protected with blockout masks during later processing steps.

Figure 6:
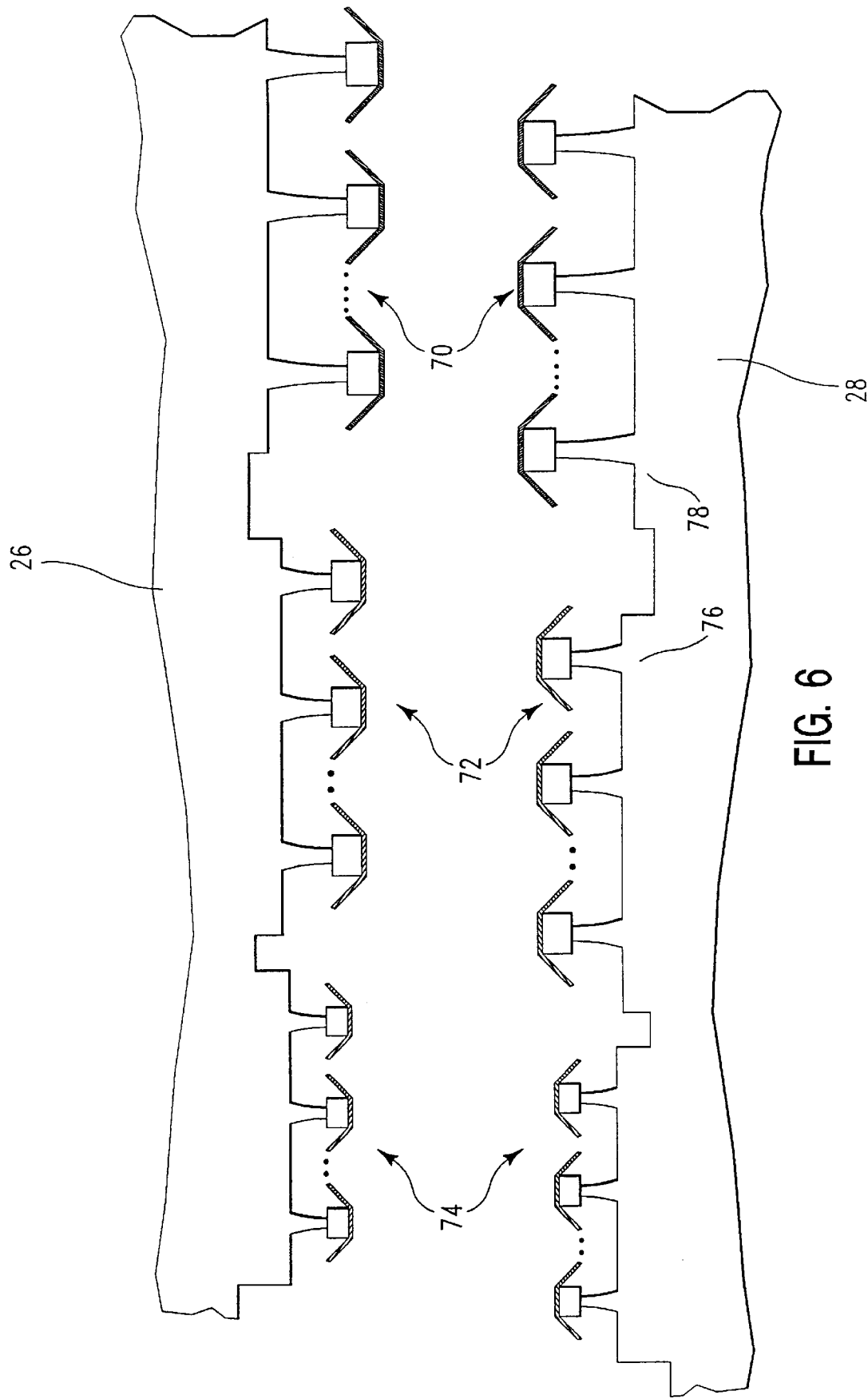
FIG. 6 is a cross sectional view of varying sizes of the microconnectors of FIG. 1 to provide gross to fine alignment of chips when stacked.

When stacking circuitry on one chip to circuitry on another chip, such as the EEPROM array described hereinabove, alignment may need to be very precise, and standard alignment systems, such as optical alignment, can be used. Alternatively, FSCs can provide a physical alignment aid. By providing FSCs of differing sizes, chips can be aligned in varying degrees as they are being pushed together. FIG. 6 depicts top chip 26 and bottom chip 28 with large FSCs 70, medium FSCs 72 and small FSCs 74. Note that raised region 76 for medium-sized FSCs 72 is higher than raised region 78 for large FSCs 70. If the raised regions were not of differing heights, the medium and small FSCs would never touch when large FSCs 70 are locked into place. Large FSCs 70 provide gross alignment, medium FSCs 72 provide medium alignment, and small FSCs 74 provide a fine alignment. Larger FSCs 70 are both wider and longer than smaller ones. The width can be controlled by adjusting the width of post 32, mask 50, and the etch of material 48 (FIGS. 3a–3e). The height can be controlled by the etch shown in FIG. 3f to create stem 34 described hereinabove. Height can also be controlled by adjusting the thickness of material 48 of flexible tops.

In the following description of chip-to-chip alignment using different size and height FSCs, typical horizontal, vertical and tolerance dimensions are given to illustrate the basic concept of FSCs to align chips. Dimensional variations and alignment tolerances typically follow a Gaussian distribution and are statistically combined as the sum of the root mean squares of various dimensions. In this example, variations are assumed to be additive, which gives a worst case estimate, that is, the combined variations will be less than calculated. This approach is easier to visualize and explain and the alignment achieved in practice would be at least as good and usually better than the estimate provided. The description is given in terms of two chips, front to front. However, two chips front to back or back to back can also be attached. Also, the method may be used to attach more than two chips in a stack. Also, while the alignment scheme is described in terms of chip to chip alignment, segments with numerous chips may be attached, including wafer to wafer attachment. Furthermore, this technique may be used with non-silicon segments such as ceramic and organic films.

Figure 7A:
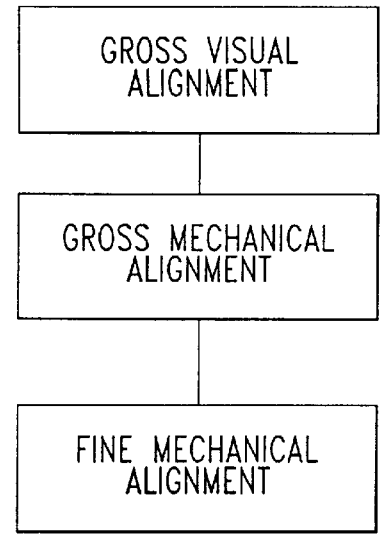
FIG. 7a is a process sequence of the present invention providing gross to fine alignment of chips in a stack.
Figure 7B:
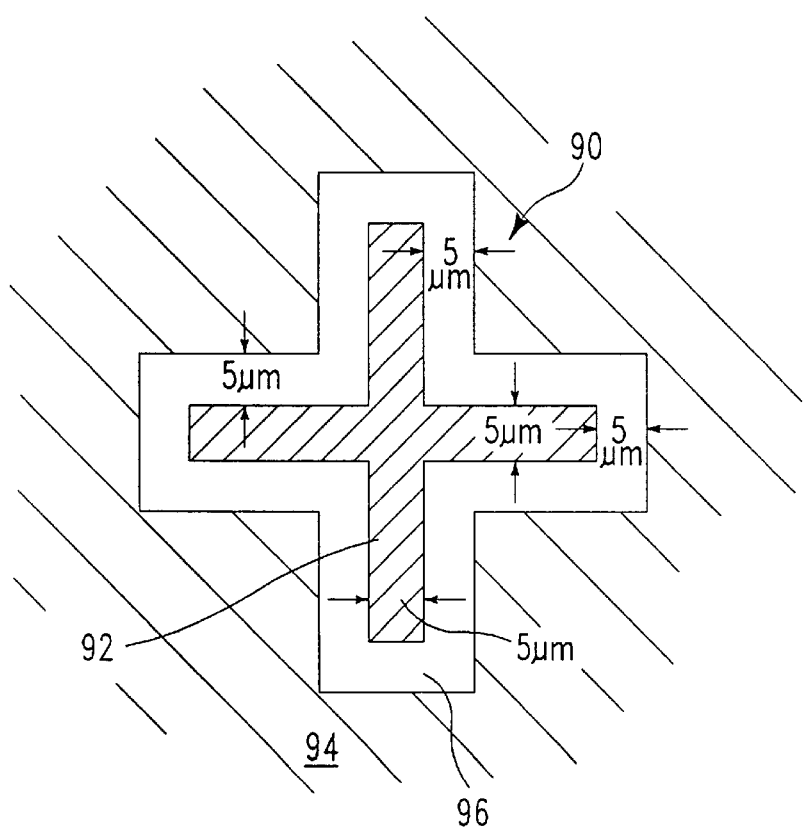
FIG. 7b is a plan view of alignment marks on stacked chips as seen in infrared light to provide gross optical alignment of chips of the stack.

FIG. 7a shows the sequence of alignment during attachment. First, a relatively gross visual alignment is provided using alignment marks on each chip designed to work with infrared radiation through the chip. FIG. 7b shows one such alignment mark, cross 90 having segments on chips 26 and 28. Segment 92 is located on one chip and segment 94 is located on another chip. Both segments 92 and 94 are formed of a material opaque to infrared radiation, such as a metal. Region 96 contains an insulator, such as silicon dioxide, or a semiconductor material such as silicon, which permits infrared radiation to pass to a detector. A photon energy less than approximately 1 ev will permit penetration of silicon. Infrared alignment of silicon wafers is well known in the semiconductor industry. Alignment mark 90 is designed to achieve an initial optical alignment of +−5 μm between chips, by way of example.

Figure 7C:
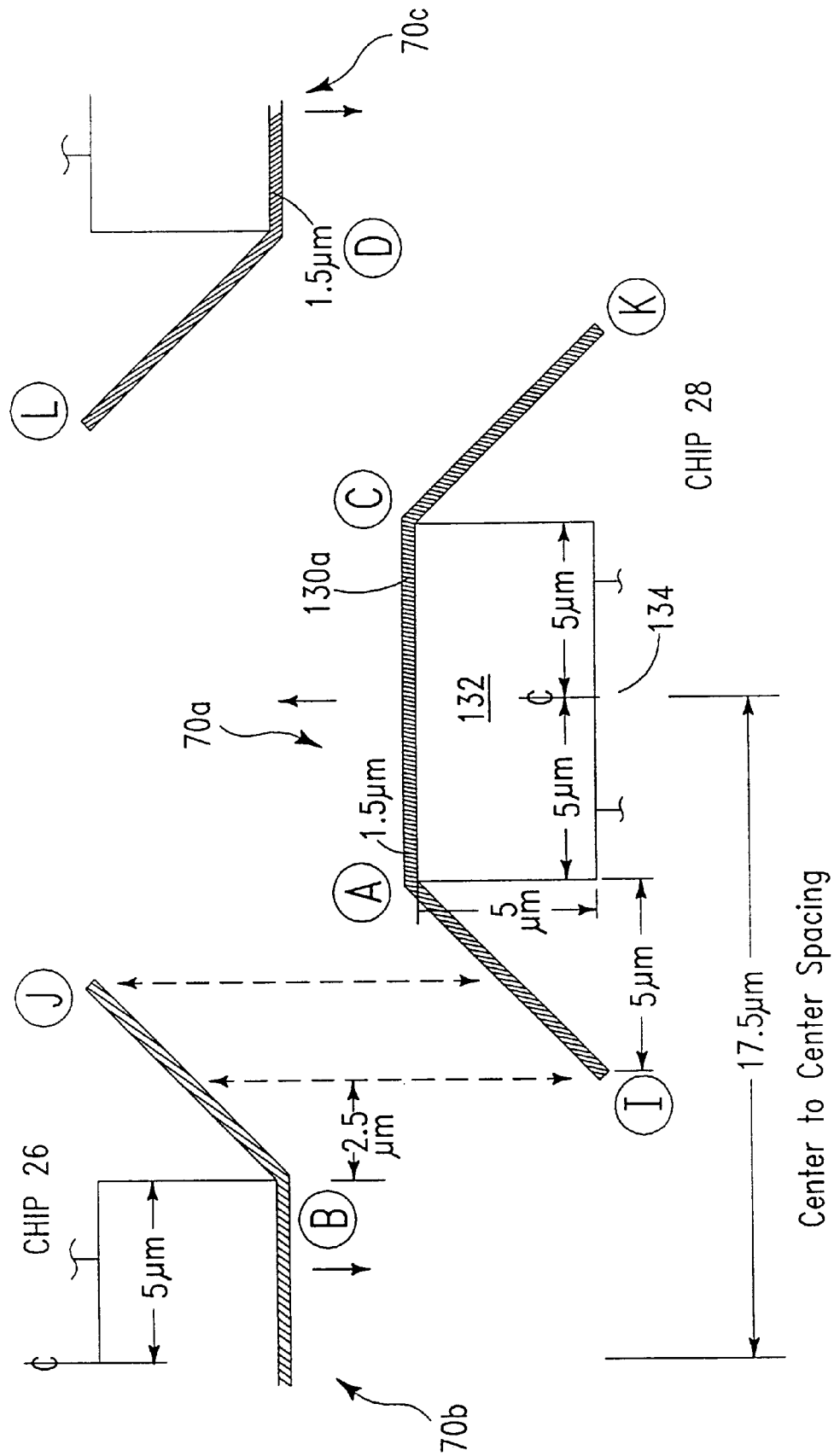
FIGS. 7c–7g are cross sectional views of varying sizes of the microconnectors of FIG. 2 to provide gross to fine alignment of chips when stacked, including typical dimensions for each part.

FIG. 7c shows portions of two larger FSCs 70b, 70c attached to chip 26 and one large FSC 70a connected to chip 28. Typical dimensions have been selected for flexible top 130 and post 132 of larger FSCs 70 used for initial gross mechanical alignment. Post 132 attaches to chip 26 via stem 134. It is assumed that the stem image will be placed with +−0.5 micrometer accuracy with respect to the nominal reference location for each chip. It is also assumed that the fabrication sequence will result in a firer variation of this image by an additional +−0.5 micrometers. The initial engagement of FSCs 70 is designed such that segment AC of flexible top 130a on FSC 70a on chip 28 is contained within space BD defined between corners of two FSCs 70b and 70c on chip 26. This is achieved by ensuring that the first optical alignment provides corner A to the right of corner B and corner C to the left of corner D. This may be expressed in the following manner:

| 2(+−0.5) | + | 2(+−0.5) | +− | x | = +−7.5 micrometer |
|---|---|---|---|---|---|
| placement variation | | fabrication variation | | initial visual alignment variation | A to B and C to D distance variation | x=+−5.5 micrometers,
where x is the accuracy of the initial gross visual alignment. Visual alignment mark 90 (FIG. 7b) uses a value of x as 5 micrometer to ensure the initial gross visual alignment requirements are met.

Figure 7D:
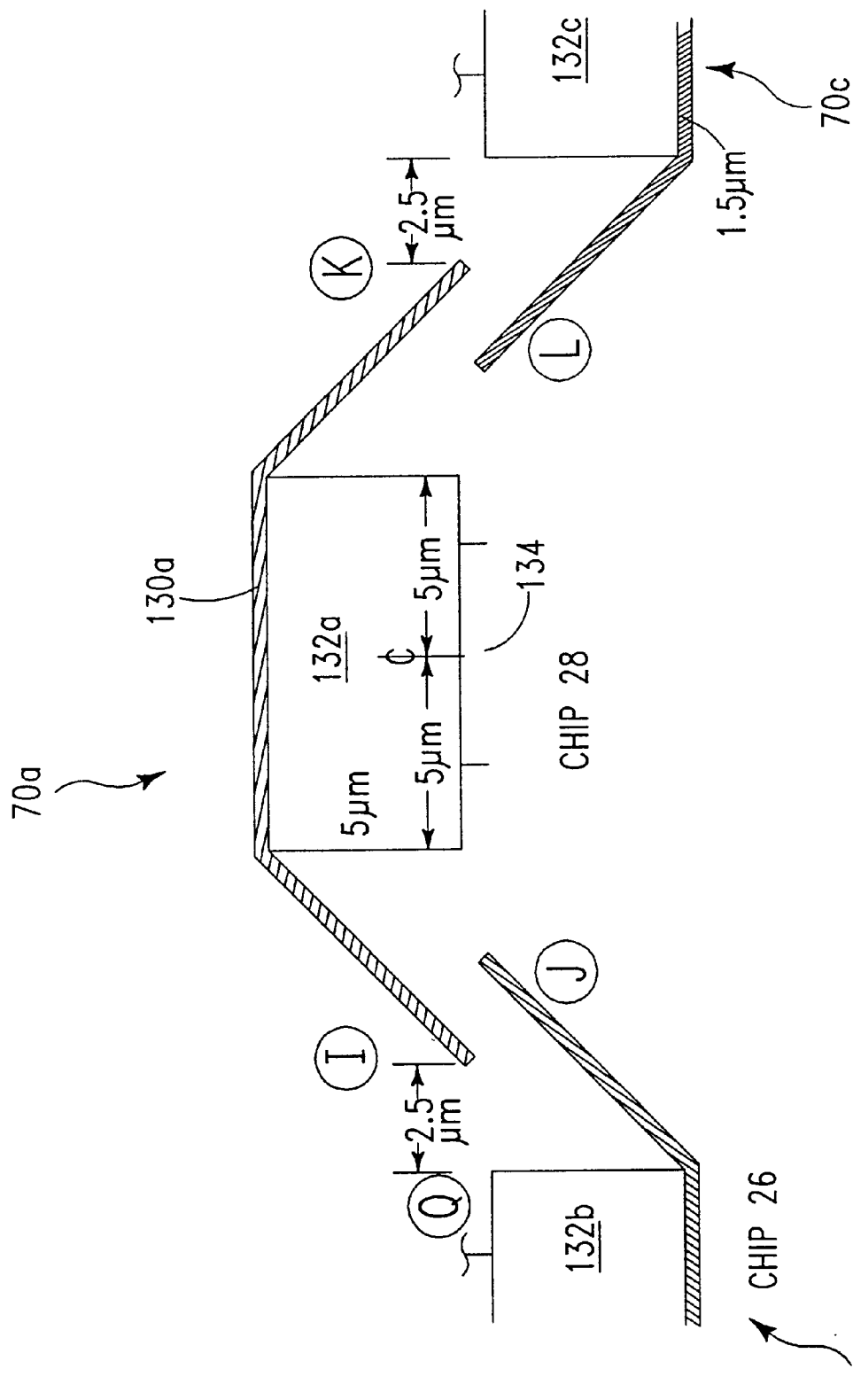

The gross mechanical alignment using FSCs 70 is achieved by mechanically forcing FSCs 70a on chip 28 past FSCs 70b, 70c on chip 26, as shown in FIG. 7d. Dimensions and spaces are shown in terms of horizontal alignment needs. Stem height for FSCs 70 is designed to accommodate the insertion distance, clearance requirements, etc (FIG. 7g). As part of the clearing requirements, the horizontal spacing of the inserted gross FSCs is such that end I of flexible top 130a (FIG. 7d) and edge Q of post 132b are 2.5 micrometers apart, and exceed 2.25 micrometers spacing between E and F, and G and H, of fine alignment FSCs 74 shown in FIG. 7e. This horizontal clearance results in a transfer of the fine horizontal control to the fine alignment FSCs shown in FIGS. 7e and 7f.

Figure 7E:
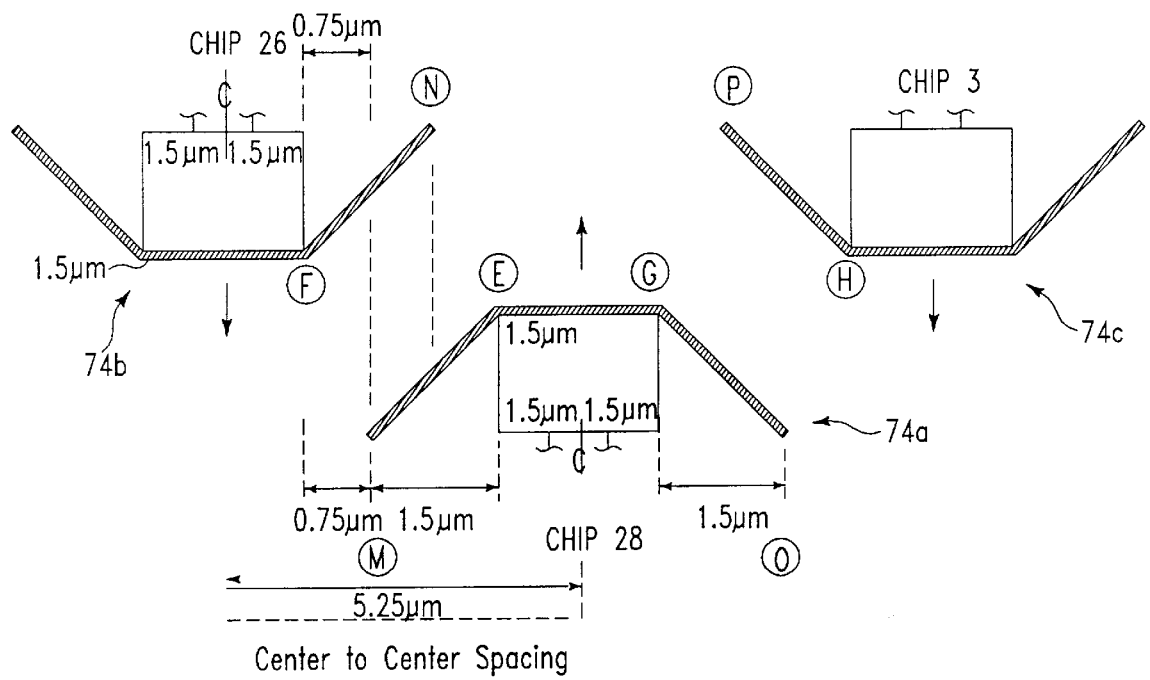
Figure 7F:
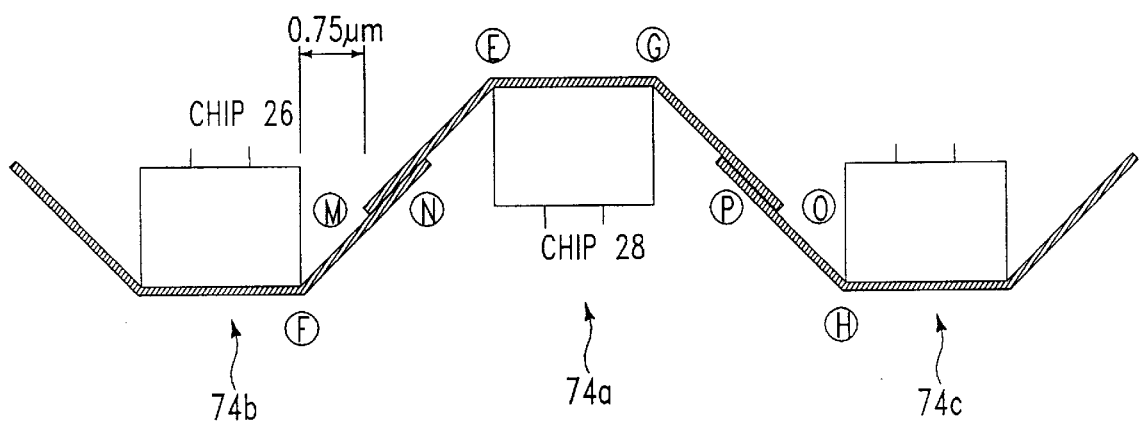
Figure 7G:
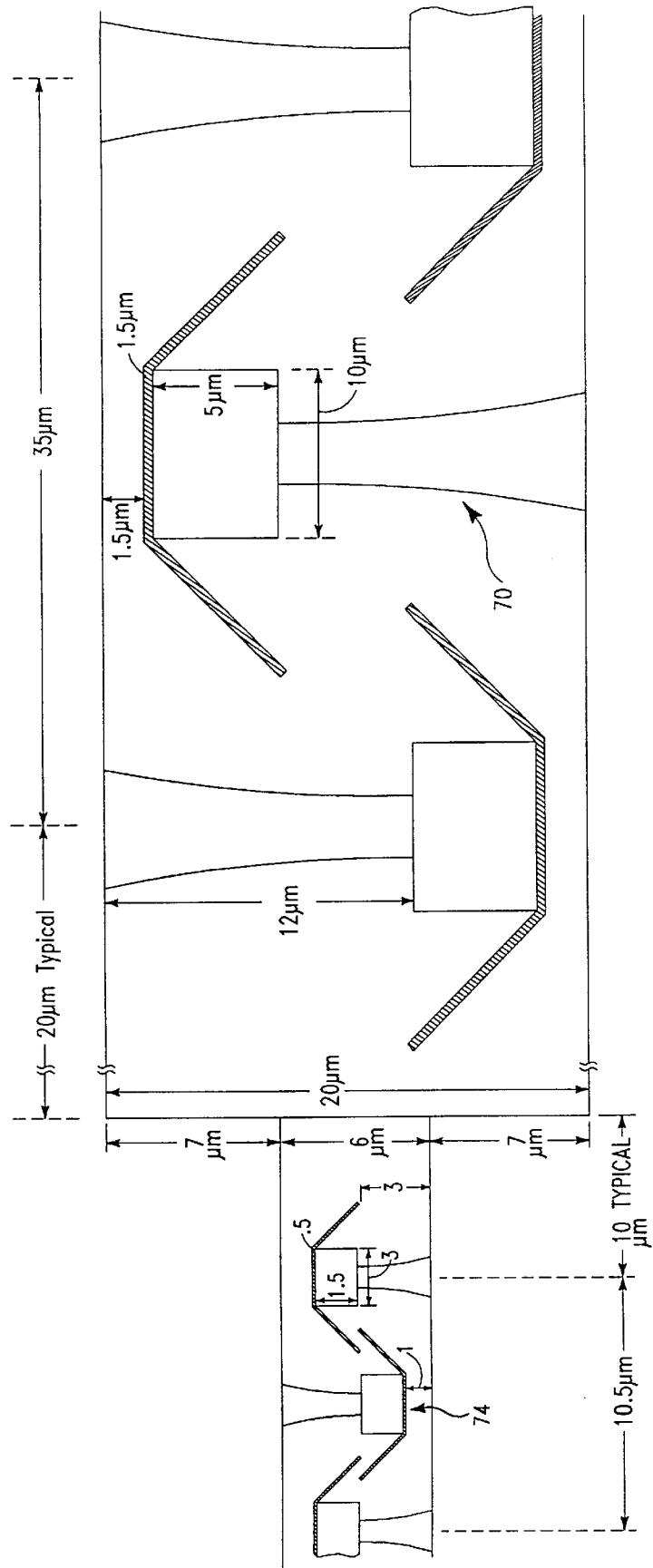

At the start of engagement, fine alignment FSCs 74 are shown in FIG. 7e. Segment EG on FSC 74a on chip 28 is contained within the space defined by FH between corners of two FSCs 74b and 74c on chip 26. As can be seen from FIG. 7e, E must remain to right of F and G to the left of H. Fine FSCs 74 begin engagement with a maximum initial variation of +−2.25 micrometers. Gross FSCs 70, after ensuring the initial alignment, allow positional variations in excess of the 2.25 micrometers allowed initially by fine FSCs 74 when positioned as shown in FIG. 7e. After fine alignment FSCs 74 are forced closer together, as shown in FIG. 7f, the alignment variation in the final configuration is +−0.75 micrometers, now controlled by the fine alignment FSCs.

FIG. 7g shows both gross and fine alignment FSCs 70 and 74 in both the horizontal and vertical directions using the dimensions in this example. Gross alignment FSCs 70 require a stem height which accommodates the thickness of posts and flexible tops of both the gross and fine alignment structures plus clearance and variations. Fine alignment structures 74 need only accommodate their post and flexible top thicknesses plus clearance and variations. A step of 7 micrometers between the base or reference level for the gross and fine FSCs is needed for the example chosen. The FSCs as shown in the example of FIG. 7g are the result of performing the alignment sequence defined in FIG. 7a and achieve a final alignment tolerance of +−0.75 micrometers determined by mechanical means. Of course additional levels of alignment can be added to achieve a smaller tolerance.

Figure 8A:
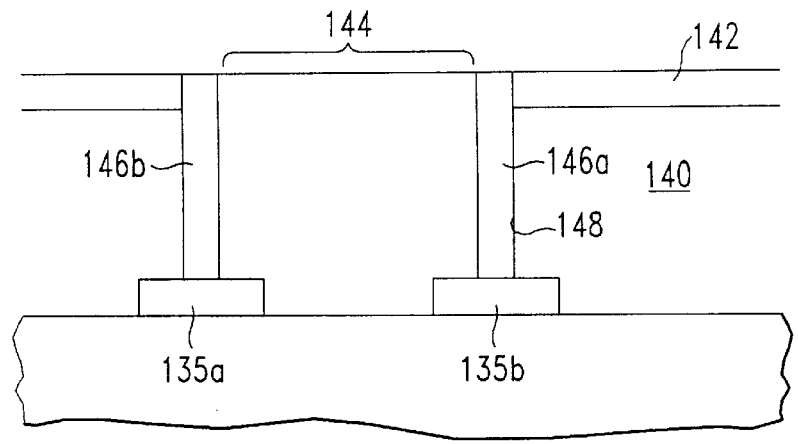
FIGS. 8a–8c are cross sectional views of process steps of the present invention for fabricating a microconnector, that is capable of providing a plurality of independent electrical contacts.
Figure 8B:
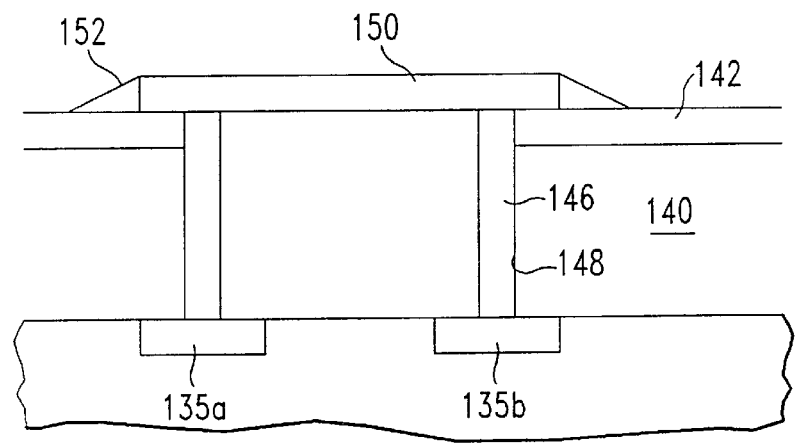
Figure 8C:
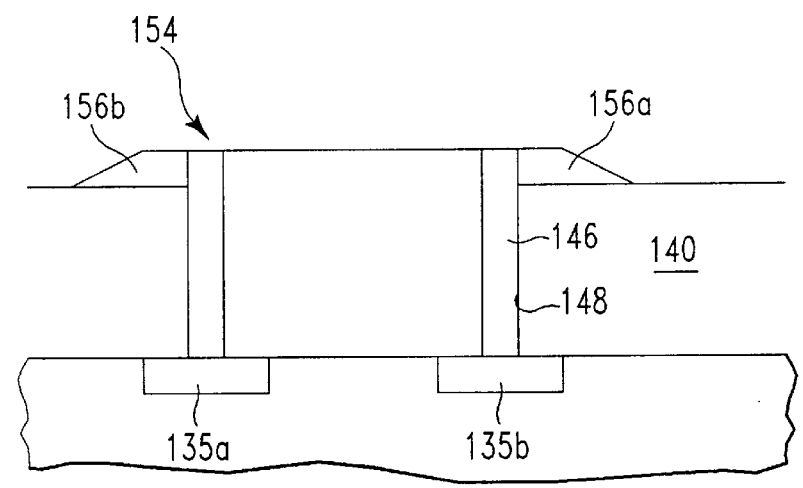

A single FSC can provide multiple independent electrical connections. FIGS. 8a–8c illustrate an alternate process for fabricating FSCs, and the process provides microconnectors each having two separate electrical conductors. As shown in FIG. 8a, separate pads 135a, 135b are formed on chip 26 by conventional means. Insulator 140, formed of a material such as polyimide, is deposited and planarized. Flexible metal layer 142 is also deposited. Window 144 in metal 142 and insulator 140 is then formed in a first masking step. Additional metal is then deposited and spacer etched leaving metal spacers 146 along four vertical sidewalls 148 of window 144. Then, in a second masking step, metal is removed from two opposing sidewalls leaving separate metal spacers 146a and 146b on two opposing sidewalls. Insulator, such as CVD oxide, is then deposited, filling window 144.

In the next step, shown in FIG. 8b, post 150 is deposited and etched (mask 3), and sloping sidewall 152 is formed as described hereinabove (FIG. 3b). A directional etch is then used to translate sloping sidewall 152 image into flexible metal layer 142, as shown in FIG. 8c. Insulator 140 is then removed to form multiple connector FSC 154 having metal latches 156a and 156b. FIG. 8c shows a microconnector having two separate electrical connections. However, more than two independent electrical connections can also be made.

FSCs can also be used to facilitate cooling. As two chips 26 and 28 are latched with microconnectors 20, elastic sealing material strips 160 on each chip are brought together forming an elastic seal 162, as shown in FIGS. 9a–9b. Such seals can be placed along edges of a chip to provide channel 164 for fluid flow. Elastic sealing material can be formed of a polymer, such as polyimide, or a metal, such as aluminum or solder. Tubes can be used to introduce fluid at one side of channel 164 and remove fluid from the other.

In addition to serving as seals for fluid flow, elastic seals can seal the edges of chips together, restricting contaminants. An elastic seal or elastic bump provided anywhere on a chip can also provide a counterforce mechanism, similar to repelling members 60 ((FIG. 5), pushing the latches of the microconnectors back into tight physical contact for improved electrical and mechanical connection.

FSCs can be used to stack chips, interconnecting the front of one chip to the back of another using either process steps described in the Han paper or as described in FIG. 3a–3f of the present invention. The steps described in the Han paper provide microconnectors having top surfaces located at about the silicon surface. If other portions of the silicon surface have electronic circuitry, however, these other portions will prevent FSCs from latching when the chips are brought together. In accordance with the present invention, "channels" (i.e., insets and/or raised regions) are useful in ensuring that the FSCs come into proper contact with each other. In one embodiment, a channel is a raised region on which the FSCs are formed. In another embodiment, a channel takes the form of an inset or aperture in a chip in which FSCs are formed.

Figure 10A:
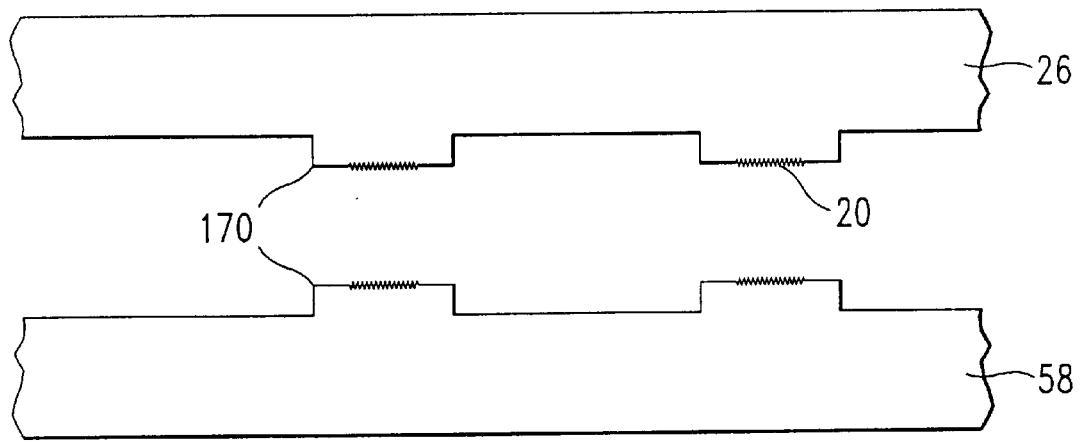
FIG. 10a is a cross sectional view of the connectors of FIG. 2 on raised areas of stacked chips to ensure a proper connection.
Figure 10B:
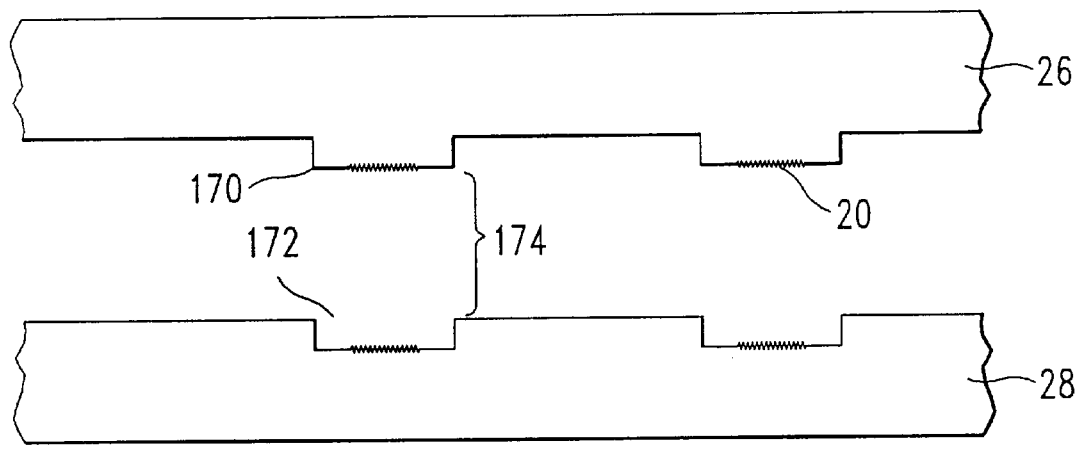
FIG. 10b is a cross sectional view of the connectors of FIG. 2 on raised areas and in mating insert areas of stacked chips to ensure a proper connection.

FIG. 10a shows oppositely disposed raised regions 170 on which FSCs 20 (see FIG. 2) are created on pads 35 of chips 26 and 28. Alternatively, FIG. 10b shows inset region 172 of raised region-inset pair 174. Either a pair of raised regions 170 or raised region-inset pair 174 help ensure proper FSC mechanical interconnection between chips of a stack.

With respect to the raised region-inset pair 174 of FIG. 10b, when chip 26 is placed on top of chip 28, raised regions 170 fit into insets 172. Depending on the height of a raised region in a raised region-inset pair, as compared to the inset, one can create a gap between chips 26 and 28 if desired. In chips stacked front to back, an inset will be in the front and a raised region in the back of a chip.

The use of two raised regions, as shown in FIG. 10, is advantageous because it allows for common processing of both chips and provides a gap between the oppositely facing circuitries of the two chips. A gap of predetermined dimensions may be used for the flow of a liquid or gas to cool a chip.

An inset in a chip is preferably formed and FSCs made therein before normal chip processing. The FSCs and the channel are filled with a material, such as oxide, before normal chip processing to protect the FSCs from chip processing steps. After processing, the material is removed, leaving the FSCs intact.

Raised regions and FSCs made thereon are fabricated after chip processing, and they can be located on or above chip circuitry. Circuitry is covered with a material, such as oxide, to protect it during the steps of fabricating the FSCs.

While FSCs in raised region-insert pairs provide mechanical connection between chips of a stack, electrical connection can be provided among many chips of a stack using chips having a structure such as that described in commonly assigned U.S. Pat. No. 5,202,754, to Bertin, et al, incorporated herein by reference. In brief, U.S. Pat. No. 5,202,754 describes vias extending through chips, connecting pads on the back surface of a chip to circuitry on the front surface. Thus, chips within the stack, held together with FSCs, would have electrical connectors on pads on both front and back sides, and these electrical connectors could also be FSCs.

Conventionally, connection pads are made of titanium, aluminum, copper or tungsten. Each connection pad contains one or more microconnectors for connecting with the mating chip. Preferably, each pad includes one microconnector available for connecting with 2 or 3 symmetrically arranged microconnectors on the mating chip. Each connection pad can be as small as three to four microns square.

Microconnectors have been described in terms of their ability to attach chips to one another or to other substrates. Microconnectors can also be used for making attachments to other semiconductor structures, such as stacks of chips, also called "cubes." For example, microconnectors can be used to attach cubes to chips, substrates, or other cubes as an alternative to other connectors, such as solder bumps. U.S. Pat. No. 5,426,566 Jun. 20, 1995 shows attachment of multi-chip cubes and individual chips to each other and to other substrates using solder bump connections. This approach, while workable, requires a hierarchy of solder melting temperatures as the different faces are attached. A paper by W. Howell, et al., "Area Array Solder Interconnection Technology for the Three-Dimensional Silicon Cube", 45th Electronic Components and Technology Conference, May 1995, provides an explanation of the characteristics of a cube connected with such solder bumps.

Figure 11:
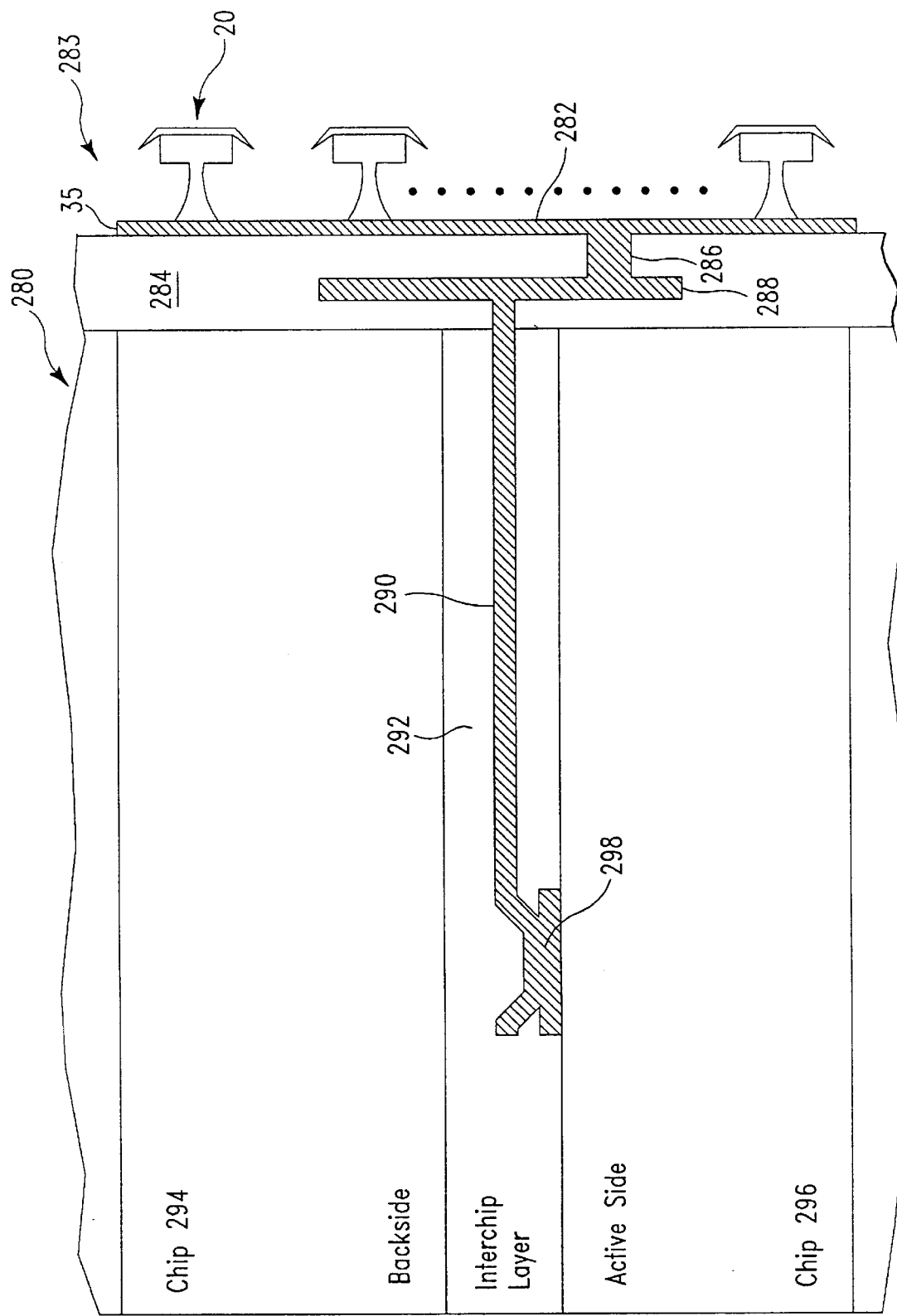
FIG. 11 is a cross sectional view of a stack of chips (a cube) having microconnectors on a side face for attachment to a chip, substrate, or other cube.

FIG. 11 shows an alternate cube that takes advantage of the present invention. Shown is a cross sectional view of cube 280 modified to use microconnectors 20 for external connection. Microconnectors 20 are located on pad 282, a part of cube side surface metallurgy, which forms base 35 for microconnectors 20. As with other substrates described hereinabove, microconnectors 20 on cube 280 can form mechanical connections and/or electrical connections, or each type at separate locations on side surface 283 of cube 280. Cube pad 282 is typically 125 by 350 micrometers, allowing for a large number of microconnectors on each such pad. Assuming each microconnector is about 10 by 10 micrometers, each pad 282 will have 437 microconnectors. Of course, smaller or larger microconnectors can be used. For example, with 20 by 20 micrometer dimensions for the microconnectors, there will be 218 microconnectors per pad.

Microconnectors 20 are attached to pad 282 located on side surface dielectric 284. Pad 282 is connected by via 286 to metal layer 288 inside dielectric 284. Metal layer 288 is connected to transfer layer 290 which is within dielectric layer 292 between chips 294 and 296. Transfer layer 290 is attached to I/O pad 298 on chip 296 which is connected to the internal circuitry of chip 296. Applying the teachings of U.S. Pat. No. 5,426,566, microconnectors 20 are used to attach side face 299 of cube 280 to other chips, cubes, or substrates. Microconnectors 20 can also be on an end face of cube 280 (not shown). FIG. 11 shows two levels of side face wiring 282 and 288, with interconnecting via hole 286. For a cube having only a single level of side face wiring, microconnectors 20 will be located on that single level (metal layer 288).

While several embodiments of the invention, together with modifications thereof, have been described in detail herein and illustrated in the accompanying drawings, it will be evident that various further modifications are possible without departing from the scope of the invention. For example, while force-responsive latching microconnectors have been described in detail here, other kinds of latching connectors can be used. Nothing in the above specification is intended to limit the invention more narrowly than the appended claims. The examples given are intended only to be illustrative rather than exclusive.

What is claimed is:

1. A semiconductor structure providing a physical interconnection to a mating substrate, comprising:
   circuitry comprising a semiconductor portion and a conductive or insulating material deposited on said semiconductor portion; and
   a plurality of microconnectors on said conductive or insulating material, said microconnectors comprising a flexible latch for mechanical connection with the mating substrate, said microconnectors comprising a portion of said deposited material.

2. A semiconductor structure as recited in claim 1, there being second microconnectors on the mating substrate, said microconnectors capable of mechanically connecting with said second microconnectors on the mating substrate.

3. A semiconductor structure as recited in claim 1, said mechanical connection being in response to a force applied between said semiconductor structure and the mating substrate.

4. A semiconductor structure as recited in claim 1, wherein said microconnectors comprise:
   an elongate stem structure, said stem structure having a sidewall; and
   a resilient material extending beyond said sidewall so as to form said latch.

5. A semiconductor structure as recited in claim 4, said latch having a sloping surface.

6. A semiconductor structure as recited in claim 1, wherein said conductive or insulating matieral on said semiconductor portion comprises an insulator and a conductor.

7. A semiconductor structure as recited in claim 1, further comprising counterforce providers for pushing said latch of said microconnectors into tight physical contact for improved electrical and mechanical connection.

8. A semiconductor structure as recited in claim 1, wherein said circuitry comprises a first subfunction of a circuit of a plurality of subfunctions of said circuit.

9. A semiconductor structure as recited in claim 8, wherein said first subfunction comprises a memory array.

10. A semiconductor structure as recited in claim 8, wherein said first subfunction comprises word line drivers.

11. A semiconductor structure as recited in claim 8, wherein said first subfunction comprises a PLA array.

12. A semiconductor structure as recited in claim 8, wherein said first subfunction comprises interconnect wiring.

13. A semiconductor structure as recited in claim 1, further comprising connectors capable of providing an electrical connection between said circuitry and the mating substrate.

14. A semiconductor structure as recited in claim 13, said connectors being one of metal bumps, pins, dendrites, fuzz buttons, repelling members, and wire bonds.

15. A semiconductor structure as recited in claim 13, said connectors being said plurality of microconnectors.

16. A semiconductor structure as recited in claim 13, one said microconnector capable of making a plurality of distinct electrical connections.

17. A semiconductor structure as recited in claim 1, wherein said plurality of microconnectors are located on a raised area on said semiconductor structure.

18. A semiconductor structure as recited in claim 1, further comprising a plurality of sizes of said microconnectors, whereby said microconnectors are capable of providing levels of alignment between said semiconductor structure and the mating substrate according to size.

19. A semiconductor structure as recited in claim 1, the semiconductor structure further comprising a seal for sealing when said mechanical connection is made with said microconnectors.

20. A semiconductor structure as recited in claim 1, wherein said circuitry is located on a face of said semiconductor portions, and wherein the mating substrate comprises a second semiconductor having circuitry on a face thereof, said microconnectors providing face to face connection there between.

21. A semiconductor structure, comprising:
   a first semiconductor chip having a first surface and a second surface, said second surface having first circuitry and first thin film levels;
   a second semiconductor chip having a third surface and a fourth surface, said third surface having second circuitry and second thin film levels; and
   a plurality of microconnectors mechanically connecting said second surface and said third surface, said microconnectors comprising a portion of said first thin film levels.

22. A semiconductor structure as recited in claim 21, wherein said plurality of microconnectors are located on one of a raised area and an insert area.

23. A semiconductor structure as recited in claim 22, said first semiconductor chip further comprising electrical contact regions on said second surface, said first semiconductor chip further comprising vias electrically connecting said first circuitry to said contact regions, said structure further comprising electrical connectors connecting said second circuitry to said contact regions.

24. A semiconductor structure as recited in claim 21, wherein said first surface faces said third surface and said microconnectors provide said mechanical connection between said first surface and said third surface.

* * * * *